(12) United States Patent
Hirano et al.

(10) Patent No.: US 7,193,326 B2
(45) Date of Patent: Mar. 20, 2007

(54) MOLD TYPE SEMICONDUCTOR DEVICE

(75) Inventors: Naohiko Hirano, Okazaki (JP);
Nobuyuki Kato, Nisshin (JP);
Takanori Teshima, Okazaki (JP);
Yoshitsugu Sakamoto, Toyohashi (JP);
Shoji Miura, Nukata-gun (JP); Akihiro Niimi, Nagoya (JP)

(73) Assignee: DENSO Corporation, Kariya (JP)

( * ) Notice: Subject to any disclaimer, the term of this patent is extended or adjusted under 35 U.S.C. 154(b) by 0 days.

(21) Appl. No.: 10/859,130

(22) Filed: Jun. 3, 2004

(65) Prior Publication Data

US 2004/0256730 A1 Dec. 23, 2004

(30) Foreign Application Priority Data

Jun. 23, 2003 (JP) ............................. 2003-178147
Jun. 27, 2003 (JP) ............................. 2003-184314

(51) Int. Cl.
*H01L 23/48* (2006.01)

(52) U.S. Cl. .................. 257/765; 257/771; 257/772; 257/E23.159; 257/E23.16

(58) Field of Classification Search ............... 257/765, 257/771, 772, E23.159, E23.16
See application file for complete search history.

(56) References Cited

U.S. PATENT DOCUMENTS

| | | | |
|---|---|---|---|
| 6,180,055 B1 * | 1/2001 | Tetsuro | .................. 420/560 |
| 6,296,722 B1 | 10/2001 | Nishimura | |
| 6,469,398 B1 * | 10/2002 | Hori | .................. 257/796 |
| 6,495,924 B2 * | 12/2002 | Kodama et al. | ............ 257/785 |
| 6,555,052 B2 | 4/2003 | Soga et al. | |
| 6,693,350 B2 | 2/2004 | Teshima et al. | |
| 6,703,707 B1 | 3/2004 | Mamitsu et al. | |
| 6,774,490 B2 | 8/2004 | Soga et al. | |
| 6,917,103 B2 * | 7/2005 | Hirano et al. | ............ 257/707 |
| 2002/0158333 A1 | 10/2002 | Teshima | |
| 2003/0022464 A1 | 1/2003 | Hirano et al. | |
| 2003/0052400 A1 | 3/2003 | Okura et al. | |
| 2003/0111739 A1 | 6/2003 | Kouzuki et al. | |
| 2003/0122232 A1 | 7/2003 | Hirano et al. | |
| 2003/0132530 A1 | 7/2003 | Teshima et al. | |
| 2003/0214037 A1 * | 11/2003 | Tellkamp | ............... 257/738 |
| 2004/0070060 A1 | 4/2004 | Mamitsu et al. | |
| 2004/0070072 A1 | 4/2004 | Mamitsu et al. | |
| 2004/0089925 A1 | 5/2004 | Fukuda et al. | |
| 2004/0089940 A1 | 5/2004 | Mamitsu et al. | |
| 2004/0089941 A1 | 5/2004 | Mamitsu et al. | |
| 2004/0089942 A1 | 5/2004 | Mamitsu et al. | |
| 2004/0097082 A1 | 5/2004 | Mamitsu et al. | |

FOREIGN PATENT DOCUMENTS

| | | |
|---|---|---|
| JP | A-S53-117970 | 10/1978 |
| JP | A-2000-223634 | 8/2000 |

(Continued)

OTHER PUBLICATIONS

Decision for Refusal issued from Japanese Patent Office issued on Jan. 23, 2006 for the corresponding Japanese patent application No. 2003-178147 (a copy and English translation thereof).

(Continued)

*Primary Examiner*—Andy Huynh
(74) *Attorney, Agent, or Firm*—Posz Law Group, PLC

(57) ABSTRACT

A mold type semiconductor device includes a semiconductor chip including a semiconductor part; a metallic layer; a solder layer; and a metallic member connecting to the semiconductor chip through the metallic layer and the solder layer. The solder layer is made of solder having yield stress smaller than that of the metallic layer. Even when the semiconductor chip is sealed with a resin mold, the metallic layer is prevented from cracking.

23 Claims, 9 Drawing Sheets

FOREIGN PATENT DOCUMENTS

| | | |
|---|---|---|
| JP | A-2001-287082 | 10/2001 |
| JP | A-2001-358460 | 12/2001 |
| JP | A-2002-118131 | 4/2002 |
| JP | A-2002-124533 | 4/2002 |
| JP | A-2003-083684 | 3/2003 |

OTHER PUBLICATIONS

Office Action issued from Japanese Patent Office mailed on Aug. 30, 2005 for the corresponding Japanese patent application No. 2003-178147 (a copy and English translation thereof).

U.S. Appl. No. 10/699,828, filed Nov. 4, 2003, Teshima et al.

* cited by examiner

MOLD TYPE SEMICONDUCTOR DEVICE

CROSS REFERENCE TO RELATED APPLICATIONS

This application is based on Japanese Patent Applications No. 2003-178147 filed on Jun. 23, 2003, and No. 2003-184314 filed on Jun. 27, 2003, the disclosures of which are incorporated herein by reference.

FIELD OF THE INVENTION

The present invention relates to a mold type semiconductor device and a method for manufacturing the same.

BACKGROUND OF THE INVENTION

A mold type semiconductor device (i.e., a semiconductor package) includes a semiconductor chip molded with resin. The semiconductor chip includes a semiconductor part such as an insulated gate bipolar transistor (i.e., IGBT). Specifically, the semiconductor package is disclosed in Japanese Patent Application Publication No. 2003-110064.

As shown in FIG. 15, the semiconductor package 36 includes a semiconductor chip 37 having an IGBT disposed on a semiconductor substrate, a lower side heat sink 38, an upper side heat sink 39 and an inner heat sink 40. The lower side heat sink 38 connects to a collector electrode of the IGBT, and the upper side heat sink 39 connects to an emitter electrode of the IGBT. The inner heat sink 40 is disposed on the top of the semiconductor chip 37. Each part is electrically connected together with a solder layer 41. A gate electrode of the semiconductor chip 37 is connected to a lead frame 42 with a gate wire 43. One side of the lower side heat sink 38 is exposed from a resin mold 44. Further, one side of the upper side heat sink 39 is also exposed from the resin mold 44, and a part of the lead frame 42 is exposed from the resin mold 44. Thus, the resin mold 44 seals the parts so that the semiconductor package 36 is provided.

The semiconductor package 36 is formed such that melted resin material pours into a mold after all parts is mounted in the mold. Then, the melted resin material is cooled and solidified so that the semiconductor package 36 is provided. At this time, the melted resin is heated up to about 180° C. Therefore, each part in the semiconductor package 36 is heated by the melted resin material. Although a stress is generated in accordance with a difference of linear expansion coefficients of the parts in the semiconductor package 36, the stress is absorbed by the solder layer 41, which connects between the parts.

However, in a case where the stress is comparatively large, the solder layer 41 cannot absorb the stress enough so that the stress is applied to the semiconductor substrate. Here, the emitter electrode of the IGBT and the IGBT itself are formed in the substrate. Therefore, when the stress is applied to the emitter electrode and the substrate, an aluminum layer composing the emitter electrode may be cracked so that the emitter electrode is removed from the substrate or the emitter electrode is damaged. Thus, the IGBT does not work precisely, or the crack prevents heat conduction so that the heat is accumulated in the IGBT. Therefore, the accumulated heat in the IGBT may damage the IGBT.

Further, when the semiconductor package 36 is mounted on equipment for operating the semiconductor chip 37, the semiconductor chip 37 generates heat so that the semiconductor package 36 is heated up to a comparatively high-temperature. Further, the semiconductor package 36 is cooled by an atmospheric temperature in usage environment. The semiconductor package 36 is applied with thermal stress under thermal cycle, so that the emitter electrode and/or the IGBT may be damaged.

Furthermore, in a case where the solder layer 41 is made of lead free solder or the like, which is comparatively hard, the above crack is generated much more.

SUMMARY OF THE INVENTION

In view of the above-described problem, it is an object of the present invention to provide a mold type semiconductor device having high endurance against stress and a method for manufacturing the mold type semiconductor device.

A mold type semiconductor device includes: a semiconductor chip including a semiconductor part; a metallic layer; a solder layer; and a metallic member connecting to the semiconductor chip through the metallic layer and the solder layer. The solder layer is made of solder having yield stress smaller than that of the metallic layer.

In the above device, even when the semiconductor chip is sealed with the resin mold, the metallic layer is prevented from cracking. Thus, the semiconductor device has high endurance against stress.

Preferably, the solder layer is made of Sn—Cu—Ni ternary alloy Also preferably, the metallic layer includes an aluminum layer made of Al—Si—Cu ternary alloy.

Preferably, the metallic layer is disposed on a surface of the semiconductor part. The metallic layer includes a first metallic layer connecting to the semiconductor part electrically. The yield stress of the solder layer is smaller than that of the first metallic layer. More preferably, the metallic layer is a multi-layered metallic layer including the first metallic layer and a second metallic layer. The second metallic layer is disposed on the first metallic layer, and made of metallic material different from that of the first metallic layer.

Further, a mold type semiconductor device includes: a semiconductor chip including a semiconductor part; a conductive layer; a connecting member; and a metallic member connecting to the semiconductor chip through the conductive layer and the connecting member. The semiconductor chip further includes: a semiconductor substrate having the semiconductor part; a first conductive layer disposed on the semiconductor substrate for providing a part of the conductive layer connecting to the semiconductor part electrically; and a second conductive layer disposed on the first conductive layer opposite to the semiconductor substrate for providing another part of the conductive layer. The second conductive layer has a Young's modulus, which is equal to or larger than that of the semiconductor substrate. The second conductive layer covers a surface and an edge of the first conductive layer.

In the above device, even when the semiconductor chip is sealed with the resin mold, the metallic layer is prevented from cracking. Thus, the semiconductor device has high endurance against stress.

Preferably, the second conductive layer has a thickness equal to or larger than 5 μm.

Preferably, the semiconductor substrate has a Young's modulus representing as Esub and a film thickness representing as Tsub. The second conductive layer has another Young's modulus representing as E and another film thickness representing as T. The Young's moduli and the film thicknesses of the semiconductor substrate and the second conductive layer have following relationship as:

$$E \times T \gtrsim E_{sub} \times T_{sub}.$$

Further, a method for manufacturing a mold type semiconductor device is provided. The semiconductor device includes a semiconductor chip having a semiconductor part and a metallic member connecting to the semiconductor chip through a metallic layer and a solder layer. The method includes the step of: forming a semiconductor part on a principal plane of a semiconductor substrate so that a cell portion is provided; forming the metallic layer on the principal plane of the semiconductor substrate; forming a first resist layer to cover a part of the metallic layer, the part corresponding to the cell portion; etching the metallic layer with the first resist layer as a mask so that a first metallic layer is provided; removing the first resist layer; forming a second metallic layer to cover a surface and an edge of the first metallic layer; and forming the solder layer on the second metallic layer. The solder layer is made of solder having yield stress smaller than that of the first metallic layer.

The above method provides the semiconductor device having high endurance against stress.

Preferably, the semiconductor chip further includes a circumferential pressure-withstand portion, which is disposed outside of the cell portion. The step of providing the first metallic layer in the cell portion further includes the step of: forming an electrode of the circumferential pressure-withstand portion. More preferably, the second metallic layer is formed on the surface of the first metallic layer by a wet electroless plating method in the step of forming the second metallic layer.

Further, a method for manufacturing a mold type semiconductor device is provided. The semiconductor device includes a semiconductor chip having a semiconductor part and a metallic member connecting to the semiconductor chip through a metallic layer and a connecting member. The method includes the steps of: forming a semiconductor part on a principal plane of a semiconductor substrate so that a cell portion is provided; forming a metallic layer on the principal plane of the semiconductor substrate; forming a first resist layer to cover a part of the metallic layer, the part corresponding to the cell portion; etching the metallic layer with the first resist layer as a mask so that a first conductive layer is provided; removing the first resist layer; and forming a second conductive layer to cover a surface and an edge of the first conductive layer. The second conductive layer has a Young's modulus, which is equal to or larger than that of the semiconductor substrate.

The above method provides the semiconductor device having high endurance against stress.

Preferably, the step of forming the second conductive layer further includes the step of: forming a third conductive layer on a surface of the first conductive layer; and forming the second conductive layer on a surface of the third conductive layer. More preferably, the second conductive layer is formed on the surface of the third conductive layer by a wet electroless plating method in the step of forming the second conductive layer.

BRIEF DESCRIPTION OF THE DRAWINGS

The above and other objects, features and advantages of the present invention will become more apparent from the following detailed description made with reference to the accompanying drawings. In the drawings:

FIG. 5 shows the semiconductor chip taken along line V—V in FIG. 6;

FIG. 11 shows the semiconductor chip taken along line XI—XI in FIG. 12;

Figure 1:
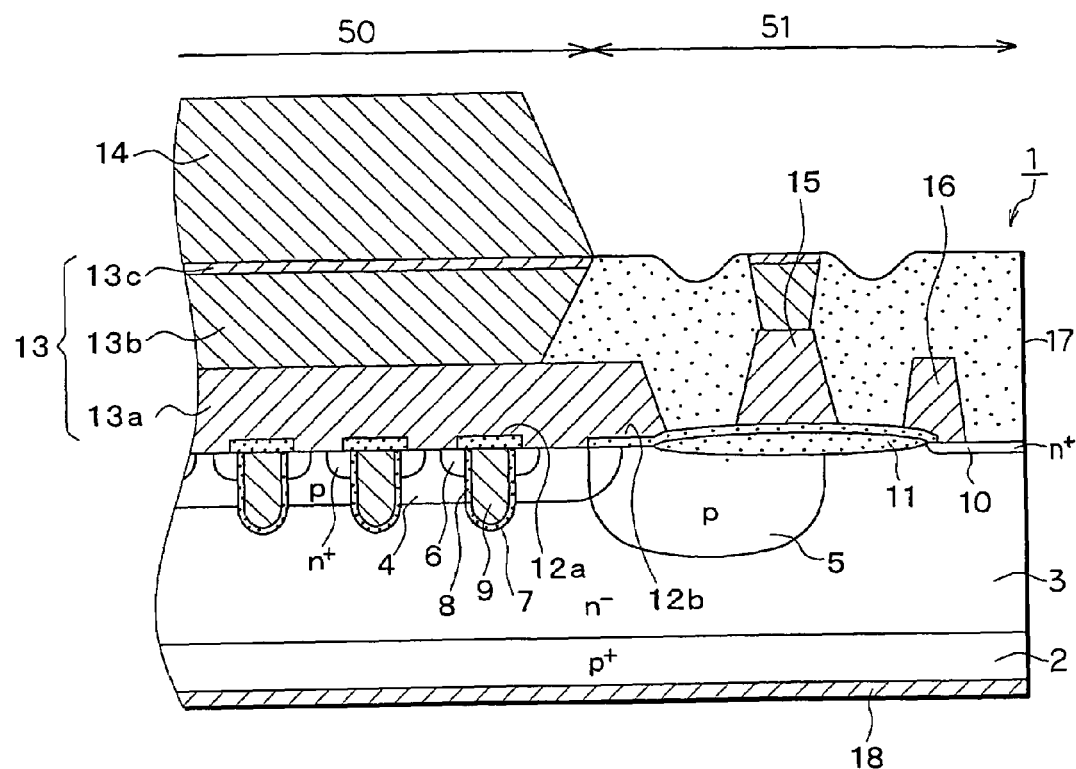
FIG. 1 is a cross sectional view showing a semiconductor chip according to a first embodiment of the present invention.

DETAILED DESCRIPTION OF THE PREFERRED EMBODIMENTS (First Embodiment)

The inventors have preliminarily studied about a relationship between an electrode material composing an electrode of a semiconductor chip in a mold type power device (i.e., a mold type semiconductor device) and a solder material composing a solder layer as a connecting material for connecting to the electrode. Specifically, the inventors have studied about yield stresses of the electrode material and the solder material. As a result, when the yield stress of the solder material is smaller than that of the electrode material, the stress generated in a thermal cycle can be absorbed in the solder layer. Therefore, the electrode is prevented from cracking. Here, the thermal cycle affects the semiconductor device such that temperature of the semiconductor device is increased and decreased when the semiconductor device is operated. Here, the yield stress is defined as a minimum stress for generating (i.e., triggering) yield phenomenon. The yield phenomenon is such that the material is drastically and plastically deformed without increasing the stress when the stress applied to material exceeds the elastic limitation of the material and reaches a predetermined value (i.e., the yield stress). In general, when the applied stress shows the maximum value in accordance with the yield phenomenon, the maximum stress is defined as the yield stress. However, in a case where the maximum stress is not obviously observed, practically, a 0.2% proof stress is defined as the yield stress. The 0.2% proof stress generates a 0.2% permanent deformation of the material. In this embodiment, when the material composing the solder layer and/or the electrode does not show the maximum stress, the 0.2% proof stress is defined as the yield stress of the material.

Specifically, when the electrode of the semiconductor chip has a multi-layered construction, preferably, the yield stress of the solder material is smaller than that of each electrode material composing the multi-layered electrode. At least in a case where the yield stress of the solder material is smaller than that of an electrode material disposed on a lower side in the multi-layered electrode, the stress is absorbed in the solder layer.

Here, there are many electrode materials, each of which has a different yield stress. In a case where the yield stress of the solder material is smaller than the yield stress of the electrode material, the stress is absorbed in the solder layer. For example, when the electrode has a three-layered construction, which includes an aluminum (i.e., Al) layer, a nickel (i.e., Ni) layer and a gold (i.e., Au) layer, the undermost layer (i.e., bottom layer) of the electrode is the Al layer, which directly connects (i.e., contacts) to the semiconductor chip. The Al layer has a comparatively small yield stress. In this case, it is required for the solder layer to have a small yield stress, which is smaller than that of the Al layer. Further, when the electrode is composed of another three-layered construction, which includes a copper (i.e., Cu) layer, a Ni layer and an Au layer, the bottom layer of the electrode is the Cu layer, which directly connects to the semiconductor chip. The Cu layer has a comparatively large yield stress. Therefore, the solder material can be selected among more materials having the yield stress smaller that that of the Cu layer.

Figure 2:
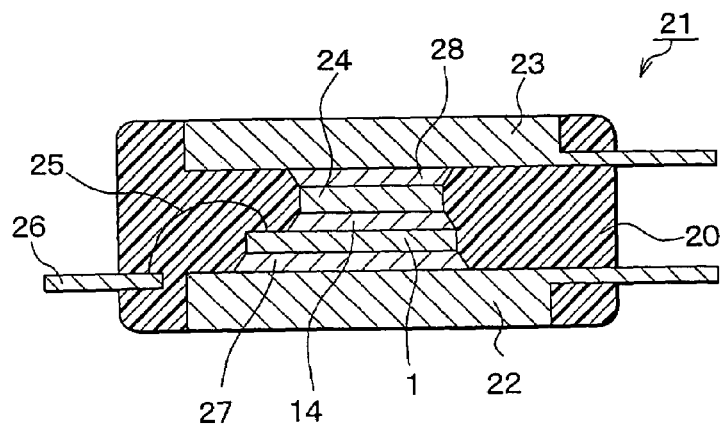
FIG. 2 is a cross sectional view showing a mold type power device including the semiconductor chip sealed with resin, according to the first embodiment.

In view of the above preliminary study, a mold type power device as a semiconductor device according to a first embodiment of the present invention is shown in FIGS. 1 and 2. The mold type power device includes a semiconductor chip 1, which is molded with resin.

The semiconductor chip 1 is formed from a semiconductor substrate such that a $N^-$ type drift layer 3 is formed on a principal plane of a $P^+$ type substrate 2. The semiconductor chip 1 includes a cell portion 50 and a covering portion (i.e., a circumferential pressure-withstand portion) 51 disposed on a periphery of the cell portion 50 for protecting the cell portion 50.

In the cell portion 50, multiple IGBTs are disposed. A P type base layer 4 is formed on a surface of the $N^-$ type drift layer 3. A $N^+$ type source layer 6 is formed on a surface of the P type base layer 4. A trench 7 is formed to penetrate both of the $N^+$ type source layer 6 and the P type base layer 4 so that the trench 7 reaches the $N^-$ type drift layer 3. A gate insulation film 8 and a gate layer 9 are formed on an inner wall of the trench 7 in this order. Thus, a trench gate structure is provided by the gate layer 9 in the trench 7 through the gate insulation film 8. A part of the $N^+$ type source layer 6 and the trench gate structure are covered with an insulation film 12a. A collector electrode 18 is formed on a backside (i.e., bottom) of the $P^+$ type substrate 2 so as to contact the $P^+$ type substrate 2.

An emitter electrode 13 is formed on the surface of the IGBT. The emitter electrode 13 includes the first, second and third metallic layers 13a–13c. The first metallic layer 13a is made of aluminum alloy, which includes aluminum (i.e., aluminum based material) such as Al—Si—Cu alloy. The second metallic layer 13b is made of Ni, and the third metallic layer 13c is made of Au. Thus, the emitter electrode 13 is composed of a multi-layered construction. A solder layer 14 is connected to (i.e., contacts) the third metallic layer 13c of the emitter electrode 13. In FIG. 1, the solder layer 14 disposed on the emitter electrode 13 is not melted.

The first metallic layer 13a covers multiple trench gate structures so that the first metallic layer 13a connects to the P type base layer 4 and the $N^+$ type source layer 6. Thus, the first metallic layer 13a commonly connects between the multiple IGBTs. The first metallic layer 13a is formed by, for example, a sputtering method. The film thickness of the first metallic layer 13a is equal to or larger than about 2 μm. This is because a strain caused by the stress affects the semiconductor substrate itself instead of the first metallic layer 13a in a case where the thickness of the first metallic layer 13a is smaller than 2 μm. Therefore, to prevent the crack in the semiconductor substrate, the first metallic layer has a thick thickness equal to or thicker than 2 μm. The crack is generated by the strain according to the stress. The first metallic layer 13a is made of Al alloy, so that the yield stress of Al alloy of the first metallic layer 13a is higher than that of the solder layer 14.

The second metallic layer 13b is made of Ni, which has excellent bonding property for bonding to the first and third metallic layers. The second metallic layer 13b is formed in a wet process such as a wet electroless plating process. The film thickness of the second metallic layer 13b is about 5 μm. The Ni composing the second metallic layer 13b is a hard material harder than the solder layer 14. Therefore, the yield stress of the Ni is higher than that of the solder layer 14.

The third metallic layer 13c is made of Au and formed by a plating method. The plated Au prevents the Ni from being oxidized and provides an excellent solder wettability of the solder layer 14. The film thickness of the third metallic layer 13c is, for example, about 0.1 μm. However, when the solder material composing the solder layer 14 is melted so that tin (i.e., Sn) in the solder material and the Ni in the second metallic layer 13b form an alloy layer, the third layer i.e., the Au dissipates (i.e., spreads) so that the third metallic layer 13c is almost disappeared, i.e., the thickness of the third layer 13c becomes almost null. The Au composing the third metallic layer 13c is a soft material. However, the thickness of the third metallic layer 13c is sufficiently thin compared with the thicknesses of the first and second metallic layers. Further, the third metallic layer 13c does not exist substantially to provide a layered structure after the solder material is melted. Therefore, it is no need for the third metallic layer 13c to take into account when the strain generated by the stress according to the difference between linear expansion coefficients is estimated.

The solder layer 14 is made of ternary solder material composed of Sn, Cu and Ni. That is, the solder layer 14 is made of a Sn—Cu—Ni ternary material. The composition of the solder layer 14 is, for example, such that the Cu in the solder layer 14 is in a range between 0.5 wt % and 2.0 wt %, the Ni is in a range between 0.05 wt % and 0.1 wt %, the Sn is the rest and a small amount of additives may be included. The solder layer 14 composed of the above composition has a small yield stress, which is smaller than that of the first metallic layer 13a.

Figure 3:
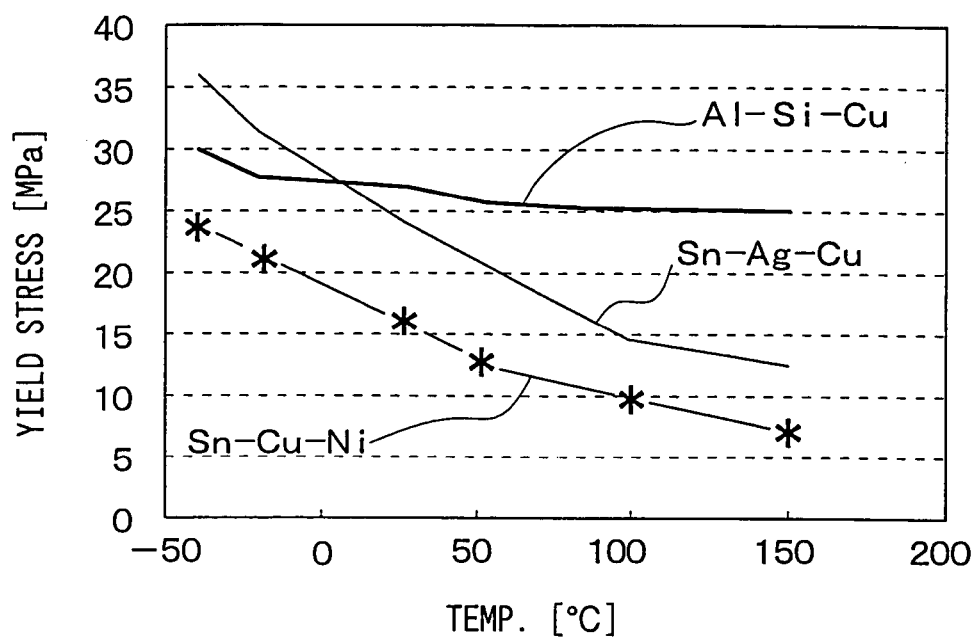
FIG. 3 is a graph showing a relationship between yield stress and several materials composing the first electrode or the solder layer.

FIG. 3 shows a relationship between temperature and yield stress of each material. In FIG. 3, Al—Si—Cu represents the first metallic layer 13a made of Al—Si—Cu ternary alloy, Sn—Ag—Cu represents a conventional lead free solder, and Sn—Cu—Ni represents the solder layer 14 according to the first embodiment. Here, the relationship of each material is evaluated in a temperature range between 40° C. and 150° C. Each material is fabricated into a certain same shape, respectively. The fabricated shape is, for example, a shape of a sample of tensile strength test or twisting test.

The yield stress of the first metallic layer 13a is always larger than that of the solder layer 14 in a temperature range between −50° C. and +150° C., in which the mold type power device is operated. In this embodiment, the solder layer 14 has the above characteristics.

Figure 4:
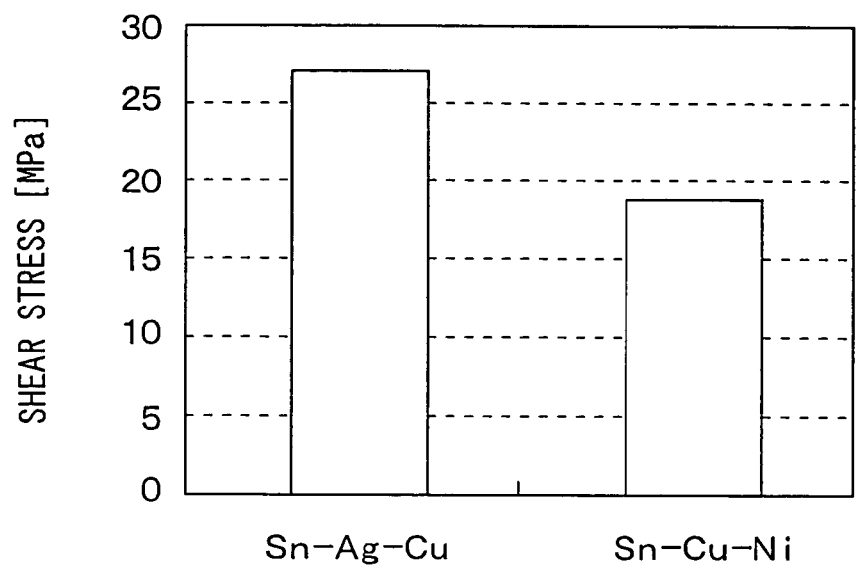
FIG. 4 is a graph showing a relationship between shear stress and several materials composing the solder layer.

When the solder layer 14 is made of the above material having the characteristics shown as Sn—Cu—Ni in FIG. 3, shear stress near the surface of the semiconductor substrate is generated as follows. FIG. 4 shows a relationship between the shear stress and the material of the solder layer 14. In FIG. 4, Sn—Ag—Cu represents a case where the first metallic layer 13a is made of Al—Si—Cu alloy, the solder layer 14 is made of Sn—Ag—Cu ternary alloy, which has the yield stress smaller than that of the first metallic layer 13a in a part of temperature range in which the mold type power device is operated. Sn—Cu—Ni represents another case where the first metallic layer 13a is made of Al—Si—Cu alloy, the solder layer 14 is made of Sn—Cu—Ni ternary alloy, which has the yield stress smaller than that of the first metallic layer 13a in a whole temperature range in which the mold type power device is operated. The shear stress is measured near the surface of the semiconductor substrate.

When the solder layer 14 is made of Sn—Cu—Ni ternary alloy, the shear stress is smaller than that in a case where the solder is made of Sn—Ag—Cu ternary alloy. This is because the yield stress of the solder layer 14 made of Sn—Cu—Ni ternary alloy is smaller than that of the first metallic layer 13a made of Al—Si—Cu ternary alloy. Further, the yield stress of the solder layer 14 made of Sn—Cu—Ni ternary alloy is smaller than that of the solder made of Sn—Ag—Cu ternary alloy.

The circumferential pressure-withstand portion 51 includes a P type layer 5 and the first electrode 15, as shown in FIG. 1. The P type layer 5 is formed on the surface of the N⁻ type drift layer 3. The first electrode 15 as a field plate is formed on the P type layer 5 through a LOCOS (i.e., local oxidation of silicon) oxidation film 11 and an insulation film 12b. A N⁺ type layer 10 is formed on the surface of the N⁻ type drift layer 3. The second electrode 16 as an outermost circumferential ring is formed to contact the N⁺ type layer 10. The first and second electrodes 15, 16 reduce electric field concentration generated in the IGBT when a surge electric field is applied to the semiconductor chip 1. Thus, the electric field intensity caused by the surge electric field is suppressed.

Further, a passivation film (i.e., protection film) 17 covers the first and second electrodes 15, 16 so that the circumferential pressure-withstand portion 51 is protected. Furthermore, the semiconductor chip 1 is sealed with the resin mold 20 so that the semiconductor package 21 is provided. As shown in FIG. 2, the semiconductor package 21 includes the semiconductor chip 1, a lower side heat sink 22, an upper side heat sink 23, an inner heat sink 24, a gate wire 25, and a lead terminal 26, all of which are sealed with the resin mold 20. A gate electrode pad for the gate electrode of the IGBT is disposed on the semiconductor chip 1. The gate electrode pad and the lead terminal 26 are connected with the gate wire 25 by a wire bonding method. A part of the lead terminal 26 is exposed from the resin mold 20. Thus, a gate driving voltage is applied to the IGBT through the lead terminal 26 from an external circuit. The gate electrode pad also has a trilaminar (i.e., triple-layered) construction, which includes an Al alloy layer disposed on a lower side, a Ni plating layer, and an Au plating layer laminated in this order.

The lead terminal 26 is connected to each gate layer 9 of the trench gate construction through the gate electrode pad. Here, the Au layer of the gate electrode pad has a film thickness about 0.1 μm, i.e., equal to or thinner than 0.2 μm. Therefore, the bonding property for bonding to the gate wire 25 is improved.

A solder layer 27 electrically connects between the top of the lower side heat sink 22 and the bottom of the semiconductor chip 1. The solder layer 14 electrically connects between the top of the semiconductor chip 1 and the bottom of the inner heat sink 24. Another solder layer 28 electrically connects between the top of the inner heat sink 24 and the bottom of the upper side heat sink 23. The emitter electrode 13 of the IGBT disposed in the semiconductor chip 1 is electrically connected to the external circuit through the inner heat sink 24 and the upper side heat sink 23. The collector electrode 18 of the IGBT is electrically connected to the external circuit through the lower side heat sink 22.

Heat conducted from the collector electrode 18 and the emitter electrode 13 of the IGBT discharges through the lower side heat sink and the upper side heat sink 22, 23. That is, the lower side and upper side heat sinks 22, 23 work as a heat conductor for releasing the heat. Further, the lower side and upper side heat sinks 22, 23 work as a current path of the IGBT for flowing the current. Therefore, the lower side and upper side heat sinks 22, 23 are made of Cu or the like, which has excellent heat conductivity and low electric resistance. A part of the lower side heat sink 22 and a part of the upper side heat sink 23 are exposed from the resin mold 20 so that the heat generated from the semiconductor chip 1 is easily radiated.

The inner heat sink 24 releases the heat to the upper side heat sink 23 through the emitter electrode 16, the heat generated in the semiconductor chip 1 and conducted from the emitter electrode 16. Further, the inner heat sink 24 electrically connects between the emitter electrode 13 and the upper side heat sink 23. The inner heat sink 24 is made of Cu or the like.

In the mold type power device, the solder layer 14 for electrically connecting to the IGBT disposed in the semiconductor chip 1 is made of the Sn—Cu—Ni ternary alloy, which has small yield stress smaller than that of the first metallic layer 13a. Therefore, the shear stress generated near the surface of the semiconductor substrate becomes small. Thus, even when the semiconductor chip 1 is sealed with the resin mold 20, the first metallic layer 13a is prevented from cracking. Thus, the emitter electrode 13 is not removed from the semiconductor substrate and the IGBT is protected from being damaged. Further, the surface of the IGBT is protected from being damaged, so that the semiconductor package 21 is protected from being damaged, the damage caused by stopping current flow or heat conduction.

Additional test is performed as follows. The test is a liquid phase cooling and heating cycle test having 3000 cycles to repeat heating and cooling between −40° C. and +125° C. In the test, when the solder layer 14 is made of Sn—Ag—Cu ternary alloy, the surface of the semiconductor substrate, i.e., the electrode layer disposed on the surface of the IGBT cracks so that the IGBT is damaged. On the other hand, the solder layer 14 is made of Sn—Cu—Ni ternary alloy, the electrode layer, i.e., the first electrode layer 13a disposed on the surface of the IGBT does not crack, so that the IGBT is not damaged. Thus, the emitter electrode 13 is protected from removing, and the IGBT is protected from being damaged. Thus, the mold type semiconductor device including the semiconductor chip 1 having high endurance against stress is provided.

In the first embodiment, the solder layer 14 is made of Sn—Cu—Ni ternary alloy having small yield stress smaller than that of the first metallic layer 13a made of Al alloy of Al—Si—Cu. The first metallic layer 13a can be made of Al—Cu, Al—Si or Al based alloy having other additives. Further, the first metallic layer 13a can be made of pure Al. Here, as long as the yield stress of the solder layer 14 is smaller than that of the first metallic layer 13a for electrically connecting to the semiconductor chip, the first metallic layer 13a and the solder layer 14 can be formed from other combinations of materials. For example, when the first metallic layer 13a is made of Al based metallic material, the solder layer 14 can be made of Sn—Cu binary alloy, Sn—Ni binary alloy or Sn—Cu—Ni ternary alloy.

Although the first metallic layer 13a works as an electrode contacting the semiconductor substrate directly, the electrode as the emitter electrode can be provided such that a barrier metal is inserted between the Al alloy and the Si substrate. In this case, the solder layer is selected to have the yield stress smaller than all yield stresses of all laminated metallic film composing the emitter electrode.

Although the first metallic layer 13a is made of Al based metallic material, the first metallic layer 13a can be made of Cu base metallic material. In this case, the solder layer 14 is formed from Sn—Ag binary alloy or Sn—Ag—Cu ternary alloy.

Although the semiconductor chip includes the IGBT, the semiconductor chip can include other semiconductor parts such as a vertical type MOSFET, a diode, and/or a bipolar transistor.

(Second Embodiment)

Figure 5:
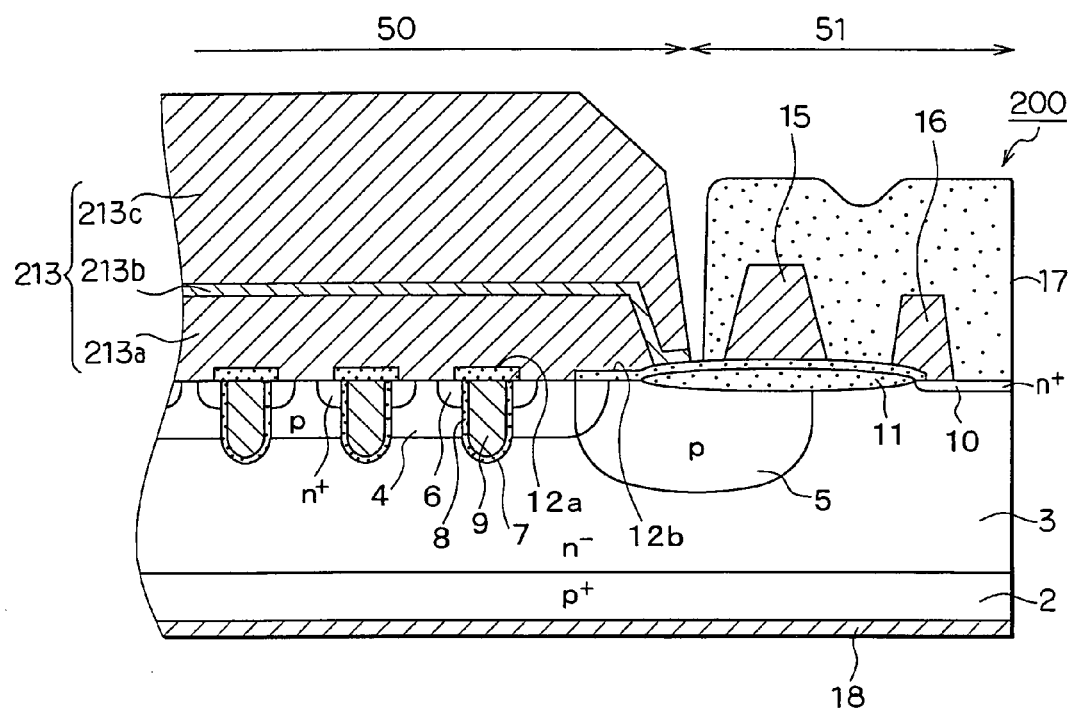
FIG. 5 is a cross sectional view showing a semiconductor chip according to a second embodiment of the present invention, specifically.
Figure 6:
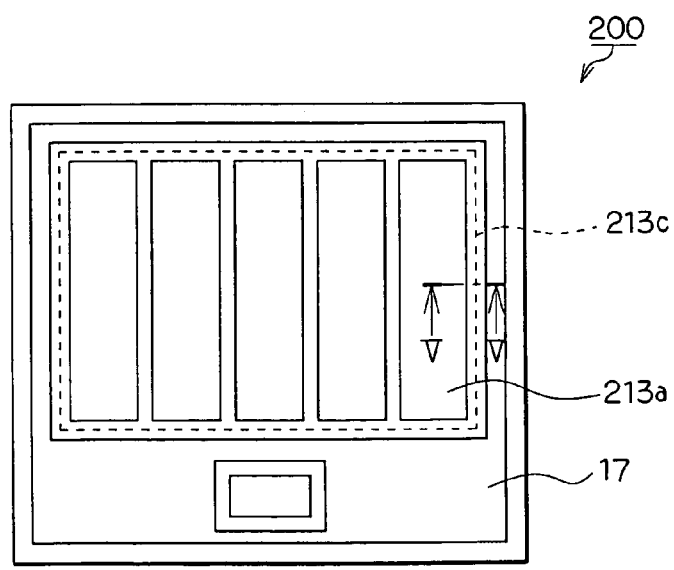
FIG. 6 is a plan view showing the semiconductor chip according to the second embodiment.

FIGS. 5 and 6 shows a semiconductor chip 200 according to a second embodiment of the present invention. In the chip 200, a circuit wiring electrode 213a for circuit wiring is disposed on the surface of the IGBT. A barrier metal layer (i.e., barrier seed layer) 213b is disposed on the surface of the wiring electrode 213a. A surface protection layer 213c for protecting the surface of the semiconductor chip 1 is disposed on the surface of the barrier metal layer 213b. The emitter electrode 213 is composed of the wiring electrode 213a, the barrier metal layer 213b and the surface protection layer 213c. The emitter electrode 213 as a conductive layer also works as a surface protection electrode for protecting the surface of the semiconductor chip 200. The thickness of the surface protection layer 213c of the emitter electrode 213 is, for example, equal to or thicker than 5 μm.

The circuit wiring electrode 213a is formed on the surface of the cell portion of the P$^+$ type substrate 2 such that the circuit wiring electrode 213a covers multiple trench gates. Further, the circuit wiring electrode 213a contacts both of the P type base layer 4 and the N$^+$ type source layer 6 so that multiple IGBTs are connected commonly. Here, the circuit wiring electrode 213a works as the first conductive layer, i.e., the circuit wiring electrode 213a corresponds to the first metallic layer 13a in FIG. 1. The thickness of the circuit wiring electrode 213a is about 3 μm, and the circuit wiring electrode 213a is made of aluminum (i.e., Al) alloy such as Al—Si—Cu alloy by a sputtering method.

The barrier metal layer 213b is a conductive metallic layer for electrically connecting to the circuit wiring electrode 213a. The barrier metal layer 213b is made of, for example, titanium (i.e., Ti) layer and a titanium nitride (i.e., TiN) layer by the sputtering method. The TiN layer is coated on the Ti layer. The barrier metal layer 213b works as a substrate (i.e., a seed layer for plating) for forming the surface protection layer 213c by a wet electroless plating method. The barrier metal layer 213b works as the third conductive layer, which does not correspond to the third metallic layer 13c in FIG. 1. The barrier metal layer 213b covers the surface and the edge of the circuit wiring electrode 213a completely.

The surface protection layer 213c is disposed only on the barrier metal layer 213b so that the surface protection layer 213c connects to the barrier metal layer 213b electrically. The surface protection layer 213c works as the second conduction layer, i.e., the surface protection layer 213c corresponds to the second metallic layer 13b in FIG. 1. The surface protection layer 213c covers the surface and the edge of the barrier metal layer 213b completely. As shown in FIG. 6, the surface protection layer 213c is disposed on a region surrounded by a dotted line in FIG. 6. The surface protection layer 213c is formed by the wet electroless plating method. The surface protection layer 213c can be soldered, and has large Young's modulus. The surface protection layer 213c is made of hard material such as Ni or Cu, i.e., a metallic material.

The Young's modulus of the surface protection layer 213c represents as E, and the film thickness of the surface protection layer 213c represents as T. Further, the Young's modulus of the semiconductor substrate, i.e., the P$^+$ type substrate 2 and the N$^-$ type drift layer 3, represents as Esub, and the thickness of the semiconductor substrate represents as Tsub. The material composing the surface protection layer 213c is determined to satisfy the relationship of E×T≅Esub× Tsub. In this case, a difference of the linear expansion coefficient between the surface protection layer 213c and the semiconductor substrate is reduced, so that stress applied to the surface protection layer 213c becomes almost equal to that applied to the semiconductor substrate in a case where the semiconductor chip 200 is sealed with the resin mold 20 or when the semiconductor package 21 is applied with thermal stress in various thermal cycles. Specifically, the circuit wiring electrode 213a is protected from affection of the stress on the basis of the difference of the linear expansion coefficient. Accordingly, the circuit wiring electrode 213a is protected from cracking, so that the circuit wiring electrode 213a is prevented from being damaged. Thus, the mold type semiconductor device including the semiconductor chip 200 having high endurance against stress is provided.

The thickness of the surface protection layer 213c is, for example, equal to or larger than 5 μm. Here, when the semiconductor chip 200 is bonded to the inner heat sink 24 with the solder layer 14, solder of the solder layer 14 made of Sn based material is heated up to high temperature so that the solder and the upper portion of the surface protection layer 213c form an alloy such as NiSn. Therefore, considering the formation of the alloy of Ni—Sn series material on the upper portion of the surface protection layer 213c, the thickness T of the surface protection layer 213c is defined to subtract the thickness of the alloy of Ni—Sn series material. Thus, the thickness of the surface protection layer 213c is set to be thicker. Even if the upper portion of the surface protection layer 213c forms the alloy, the thickness of the surface protection layer 213c can be secured sufficiently.

Next, the manufacturing method for manufacturing the semiconductor chip 200 is shown in FIGS. 4A–5C.

At first, the N$^-$ type drift layer 3 is formed on the principal plane of the P$^+$ type substrate 2 so that the semiconductor substrate is provided. Then, the IGBT is formed. Next, the P type base layer 4 and the N$^+$ type source layer 6 are formed on the surface portion of the N$^-$ type drift layer 3. Then, the trench 7 is formed such that the trench 7 penetrates through the N$^+$ type source layer 6 and the P type base layer 4 and reaches the N$^-$ type drift layer 3. The gate insulation film 8 and the gate layer 9 are formed on the inner wall of the trench 7 in this order. The insulation film 12a is formed to cover a part of the $N^+$ type source layer 6 and the trench 7.

Figure 7A:
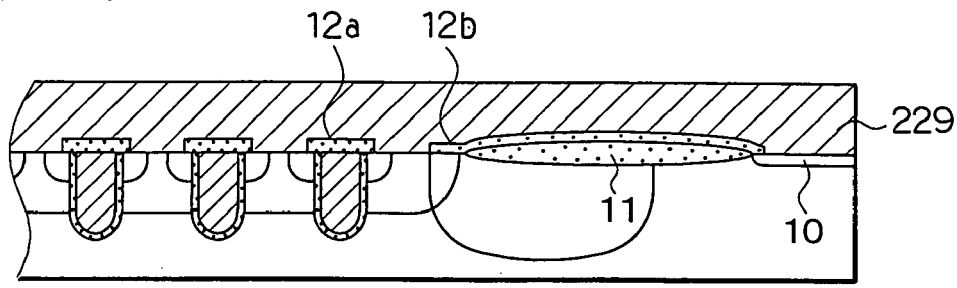
FIGS. 7A–8C are cross sectional views explaining a method for manufacturing the semiconductor chip, according to the second embodiment.

In the first process shown in FIG. 7A, a metallic layer 229 is formed on the principal plane of the semiconductor substrate, the principal plane on which the IGBT is provided. The thickness of the metallic layer 229 is about 3 μm. The metallic layer 229 is made of aluminum or the like.

Figure 7B:
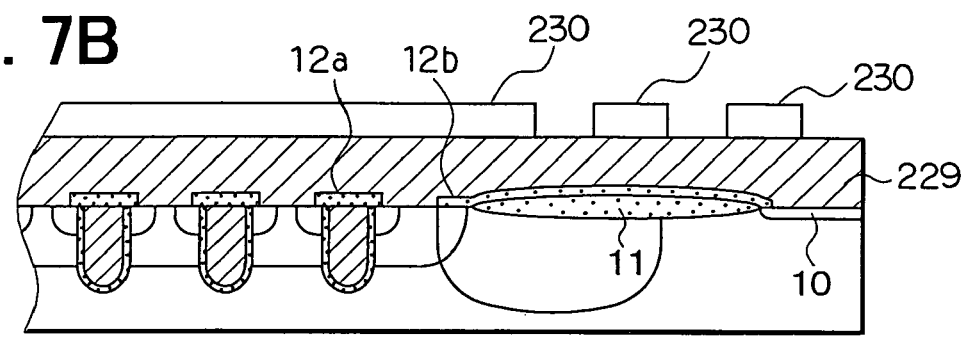

In the second process shown in FIG. 7B, a photo resist film 230 is coated on the metallic layer 229, and then, the photo resist film 230 is patterned by a photolithography method. Thus, the photo resist has openings, which are disposed except for a circuit-wiring-electrode-to-be-formed region, a first-electrode-to-be-formed region and a second-electrode-to-be-formed region.

Figure 7C:
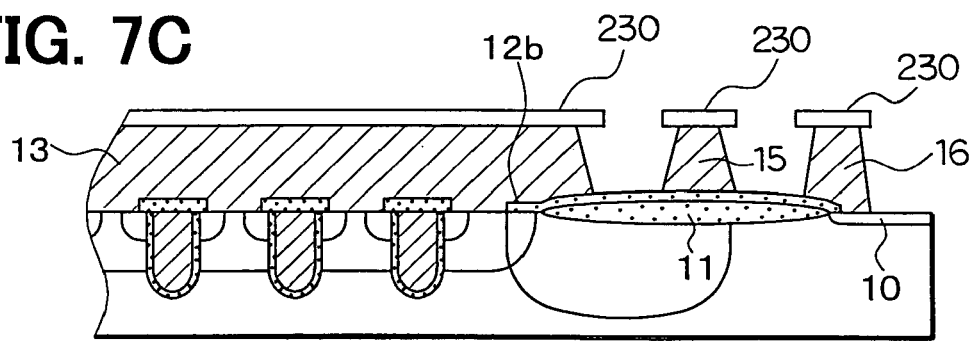

In the third process in FIG. 7C, the metallic layer 229 is etched by a wet etching method with the photo resist film 230 as a mask, so that the metallic layer 229 is patterned. Thus, the circuit wiring electrode 213a in the cell portion 50 and the first and second electrodes 15, 16 in the circumferential pressure-withstand portion 51 are formed. In this third process, i.e., the wet-etching process, the metallic layer 229 is side-etched, i.e., the side of the metallic layer is etched, so that the upper portion of the metallic layer 229 disposed under the photo resist film 230 is over-etched. Specifically, the upper portion of the metallic layer 229 disposed inside of the opening of the photo resist film 230 is removed, as shown in FIG. 7C. Then, the photo resist film 230 is removed.

Figure 7D:
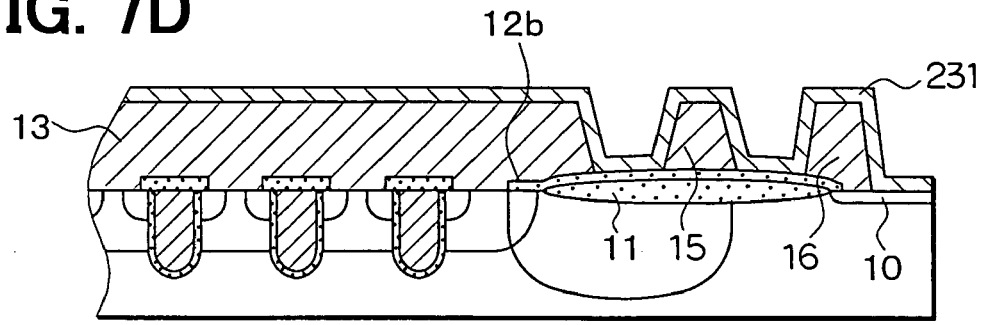

In the fourth process shown in FIG. 7D, the Ti layer and the TiN layer for forming a metallic thin film 231 is formed. The metallic thin film 231 covers the circuit wiring electrode 213a and the first and second electrode 15, 16 in the circumferential pressure-withstand portion 51.

Figure 8A:
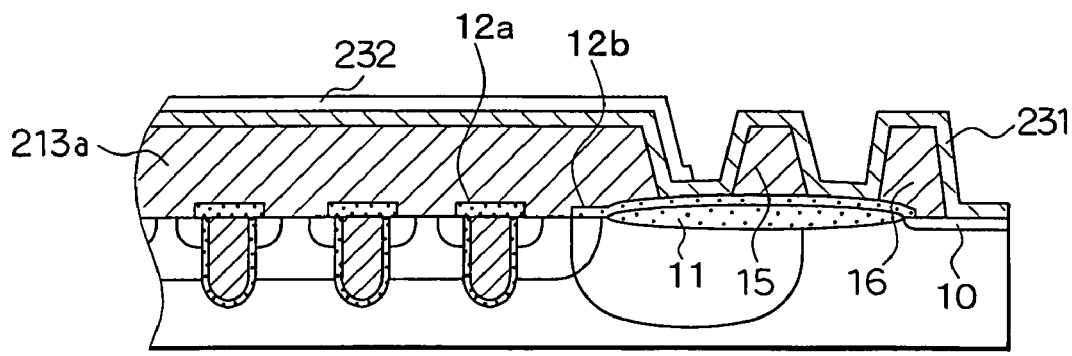

In the fifth process shown in FIG. 8A, another photo resist film 232 is formed on the metallic thin film 231. The photo resist film 232 is larger than the circuit wiring electrode 213a so that the surface and the edge of the circuit wiring electrode 213a is completely covered with the photo resist film 232. Specifically, the photo resist film 232 is larger than the edge (i.e., outline) of the circuit wiring electrode 213a. Then, the metallic thin film 231 is etched and removed by the photolithography method with the photo resist film 232 as a mask. Thus, the barrier metal layer 213b is formed such that the barrier metal layer 213b covers the surface and the edge of circuit wiring electrode 213a. Then, the photo resist film 232 is removed.

Figure 8B:
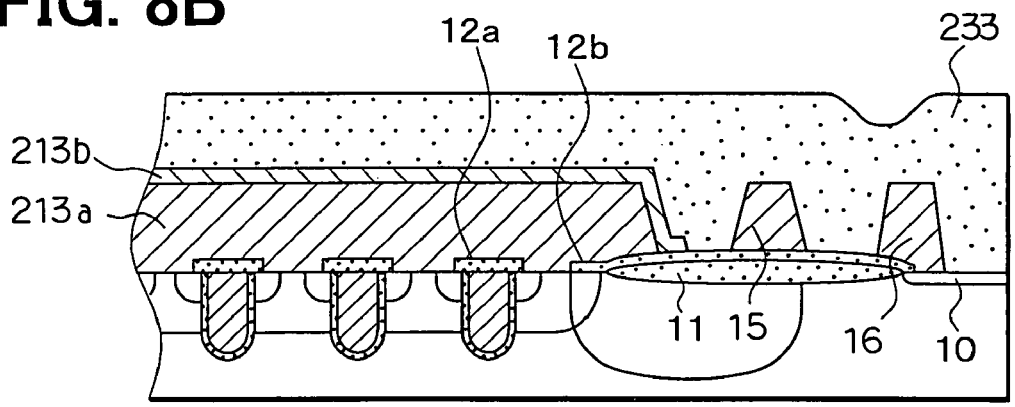
Figure 8C:
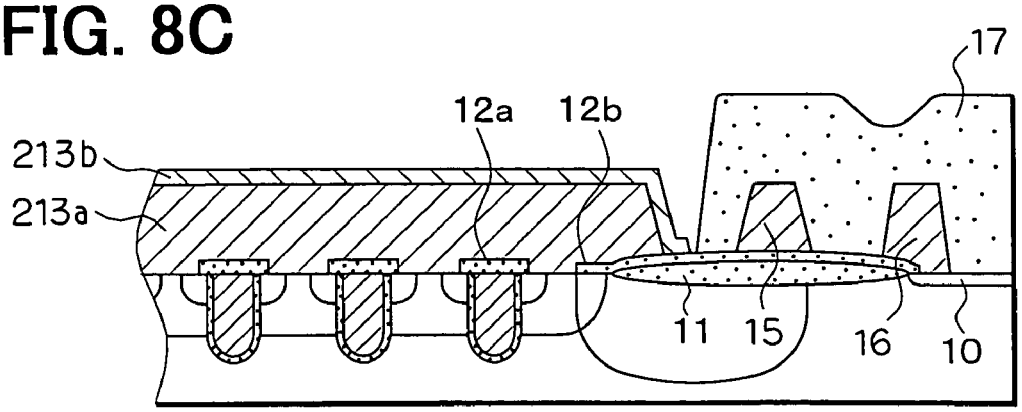

In the sixth process shown in FIG. 8B, a passivation (i.e., protection) film 233 made of poly-imide or the like is formed. In the seventh process shown in FIG. 8C, a part of the passivation film 233 disposed on the barrier metal layer 213b is removed so that the passivation film 17 is formed on the surface including the circumferential pressure-withstanding portion 51.

Then, the surface protection layer 213c made of metallic material such as Ni or Cu, which has high Young's modulus and is capable of soldering, is formed by the wet electroless plating method. The thickness of the surface protection layer 213c is equal to or larger than 5 μm. Here, the surface protection layer 213c is disposed only on the barrier metal layer 213b. Therefore, the surface protection layer 213c is not disposed on the passivation film 17. In some cases, the collector electrode 18 is formed on the backside of the $P^+$ type substrate 2. Then, the semiconductor substrate is cut into multiple semiconductor chips 1 by a dicing cut method. Thus, the semiconductor chip 200 is completed.

Thus, the semiconductor chip 200 manufactured in the above processes are connected to the lower side heat sink 22 and the inner heat sink 24 through the solder layer 14, 27, respectively. Then, the gate electrode pad of the semiconductor chip 200 and the lead terminal 26 are connected each other with the gate wire 25. Here, the gate electrode pad is disposed on a rectangular region shown in downside in FIG. 6. Then, the upper side heat sink 23 is bonded to the inner heat sink 24 through the solder layer 28. Then, the above parts are disposed in a mold for forming the semiconductor package 21, and then, the melted resin providing the resin mold 20 is flows into the mold. The melted resin is cooled and solidified so that the resin mold 20 seals the parts, and the semiconductor package 21 is formed.

Thus, even when the semiconductor package 21 seals the parts, the stress applied to the circuit wiring electrode 213a is relaxed (i.e., reduced). This is because the circuit wiring electrode 213a covers the surface of the semiconductor substrate, the surface protection layer 213c, which is hard, covers the surface and the edge of the circuit wiring electrode 213a, and the stress applied to the surface protection layer 213c is almost equal to that applied to the semiconductor substrate. The circuit wiring electrode 213a is covered with the surface protection layer 213c. Accordingly, the circuit wiring electrode 213a is prevented from being damaged (i.e., cracking). Further, the IGBT is protected from being damaged thermally, which is caused by the damage of the circuit wiring electrode 213a such as an intercept of current flowing through the IGBT or an intercept of heat conducting through the IGBT.

Although the surface protection layer 213c is determined to satisfy the relationship of $E \times T \cong E_{sub} \times T_{sub}$, the surface protection electrode 213c can be another electrode as long as the electrode withstands the stress applied from the outside of the semiconductor chip 1. Specifically, the Young's modulus of the surface protection layer 213c is required at least to be equal to or larger than the Young's modulus of the semiconductor substrate. In this case, the stress generated because of resin molding (i.e., resin sealing) of the semiconductor package 21 or the stress generated in the thermal cycle is reduced by the surface protection layer 213c. Therefore, the stress is prevented from conducting to the circuit wiring electrode 213a.

Further, in the fifth process shown in FIG. 8A, the photo resist film 232 can be formed by using the same mask as a mask for forming the photo resist film 230 used in the second process shown in FIG. 7B. When the circuit wiring electrode 213a is formed by etching, the edge of the metallic layer 229 disposed under the photo resist film 230 is side-etched. Therefore, in the fifth process, when the photo resist film 232 is formed with using the mask for forming the photo resist layer 232, which is the same as the mask used in the above etching process of the metallic layer 229, the photo resist film 232 is formed such that the photo resist film 232 covers the surface and the edge of the circuit wiring electrode 213a. Therefore, when the metallic thin film 231 is etched, a part of the metallic thin film 231 disposed at the edge of the circuit wiring electrode 213a is not removed, so that the barrier metal layer 213b covers the circuit wiring electrode 213a completely. Thus, even if the photo resist film 232 is formed by using the same mask as a mask for forming the photo resist film 230, the surface protection layer 213c can cover the circuit wiring electrode 213a completely. Here, in this case, when the circuit wiring electrode 213a is covered with the photo resist film 232, the photo resist film 232 is formed to cover the first and second electrodes 15, 16 in the circumferential pressure-withstand portion 51. Then, the metallic thin film 231 is removed, and then, the metallic thin film 231 is partially remained on the surface of the first and second electrodes 15, 16. However, this residual metallic thin film 231 disposed in the circumferential pressure-withstand portion 51 is covered with the passivation film 17 completely. Therefore, the residual metallic thin film 231 does not affect negatively.

Furthermore, although the barrier metal layer 213b is formed on the circuit wiring electrode 213a, the barrier metal layer 213b can be omitted. This is because the surface protection layer 213c can be formed directly on the circuit wiring layer 213a made of aluminum by the plating method.

Although the surface protection layer 213c is formed by the plating method, the surface protection layer 213c can be formed by other methods such as a sputtering method. However, it is preferred that the surface protection layer 213c is formed by the plating method, since the plating method can provide a thick surface protection layer 213c easily. As described above, the thickness of the surface protection layer 213c is required to have a certain thickness.

(Third Embodiment)

Figure 9:
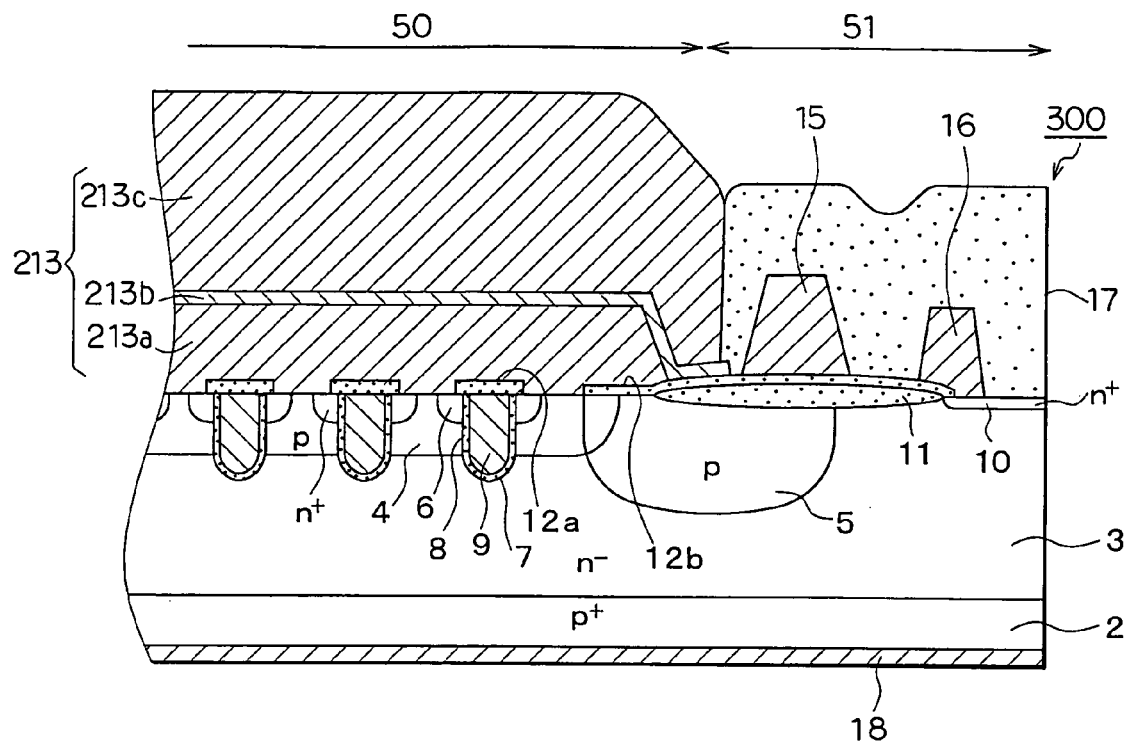
FIG. 9 is a cross sectional view showing a semiconductor chip according to a third embodiment of the present invention.

A semiconductor chip 300 according to a third embodiment of the present invention is shown in FIG. 9. The surface protection layer 213c contacts the passivation film 17.

The semiconductor chip 300 according to the third embodiment is almost the same as the processes shown in FIG. 7A-8C. The manufacturing method for manufacturing the semiconductor chip 300 according to the third embodiment is explained as follows with reference to the drawings of FIGS. 7A–8B and 10.

Figure 10:
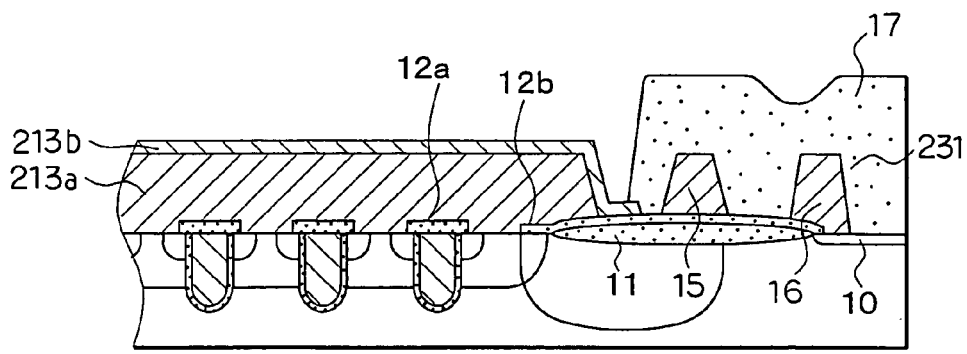
FIG. 10 is a cross sectional view explaining a method for manufacturing the semiconductor chip, according to the third embodiment.

At first, the processes shown in FIGS. 7A–8B are performed, so that the passivation film 233 is formed on the barrier metal layer 213b. Then, another photo mask, which is different from the photo mask used in the seventh process shown in FIG. 8C, is used to remove a part of the passivation film 233 disposed on the circuit wiring electrode 213a, as shown in FIG. 10. Thus, the passivation film 17 is formed on the edge of the barrier metal layer 213b.

Then, the surface protection layer 213c is formed on the surface of the barrier metal layer 213b by the wet electroless plating method. At this time, the barrier metal layer 213b is formed inside of the passivation film 17, so that the surface protection film 213c is formed to contact the passivation film 17, as shown in FIG. 9. Thus, the semiconductor chip 300 is completed.

In the semiconductor chip 300 according to the third embodiment, the surface protection layer 213c covers the surface and the edge of the circuit wiring electrode 213a completely. Therefore, the circuit wiring electrode 213a is not applied with the stress, so that the circuit wiring electrode 213a is not damaged.

(Fourth Embodiment)

Figure 11:
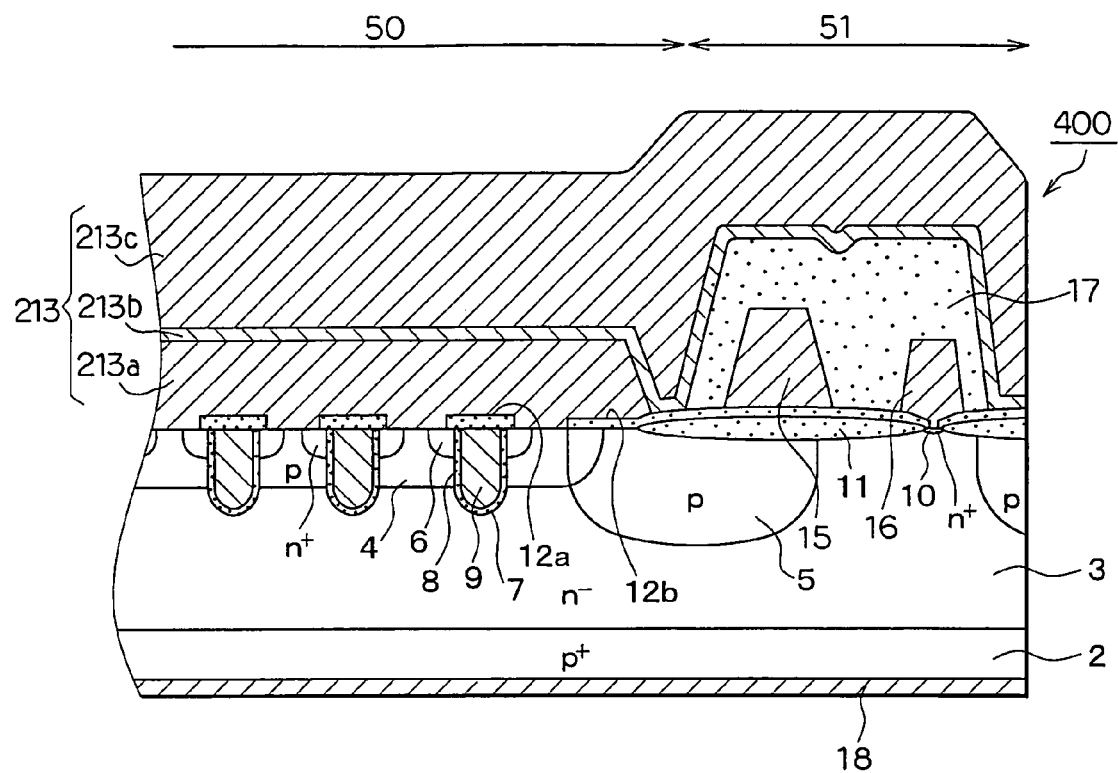
FIG. 11 is a cross sectional view showing a semiconductor chip according to a fourth embodiment of the present invention, specifically.
Figure 12:
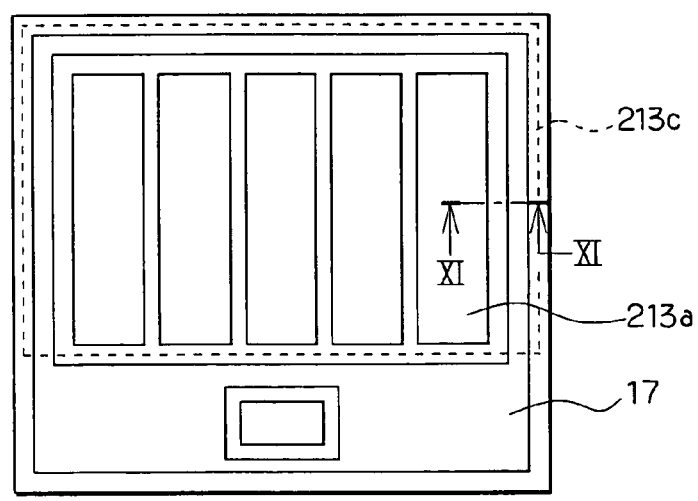
FIG. 12 is a plan view showing the semiconductor chip according to the fourth embodiment.

A semiconductor chip 400 according to a fourth embodiment of the present invention is shown in FIGS. 11 and 12. The barrier metal layer 213b covers the circuit wiring layer 213a and the passivation film 17. Therefore, the emitter electrode 213 is formed on the whole area of the cell portion 50 and the circumferential pressure-withstand portion 51. To secure (i.e., to increase) the withstand pressure at the circumferential pressure-withstand portion 51, a P type region and an insulation film is formed on the surface of the semiconductor substrate (i.e., the N⁻ type drift layer 3) at the outmost periphery of the semiconductor chip 400. Specifically, the LOCOS oxidation film 11 and the insulation film 12b are formed on the surface at the outmost periphery. The surface protection layer 213c is formed on a region surrounded by a dotted line in FIG. 12.

Figure 13A:
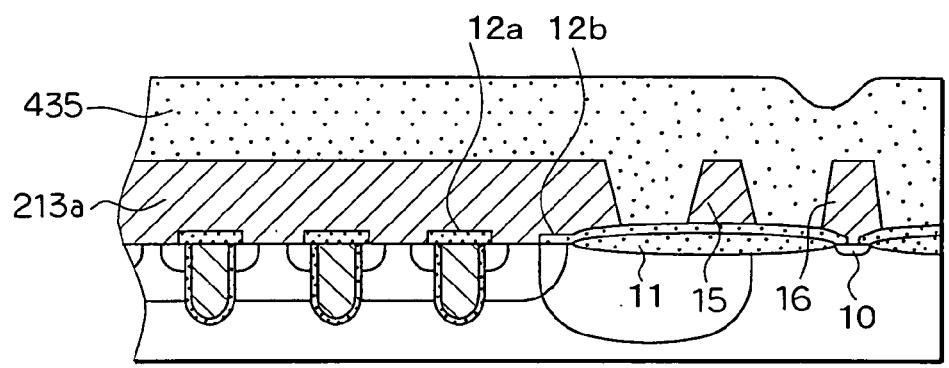
FIGS. 13A and 13B are cross sectional views explaining a method for manufacturing the semiconductor chip, according to the fourth embodiment.

The semiconductor chip 400 is manufactured as follows. At first, the processes shown in FIGS. 7A–7C are performed, so that the circuit wiring electrode 213a in the cell portion 50 and the first and second electrodes 15, 16 in the circumferential pressure-withstand portion 51 are formed. Then, the photo resist film 230 is removed. As shown in FIG. 13A, a passivation film 435 is formed on the whole surface of the semiconductor substrate. Then, a part of the passivation film 435 disposed on the surface of the circuit wiring electrode 213a is removed, so that the passivation film 17 is provided in the circumferential pressure-withstand portion 51.

Figure 13B:
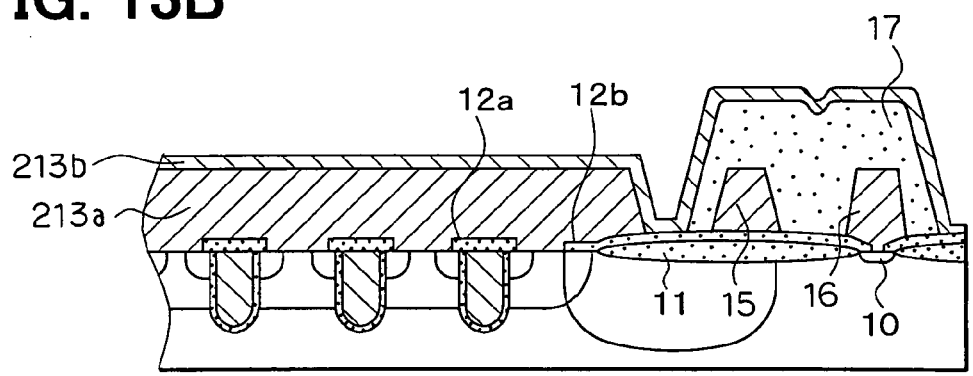

As shown in FIG. 13B, the barrier metal layer 213b is formed on the whole surface of the semiconductor substrate. Then, the surface protection layer 213c is formed on the barrier metal layer 213b by the wet electroless plating method. Thus, the semiconductor chip 400 is completed.

In the semiconductor chip 400 according to the fourth embodiment, the surface protection layer 213c covers the surface and the edge of the circuit wiring electrode 213a completely. Therefore, the circuit wiring electrode 213a is not applied with the stress, so that the circuit wiring electrode 213a is not damaged.

In this embodiment, the barrier metal layer 213b cannot be omitted. This is because the surface protection layer 213c is required to form on the passivation film 17 made of poly-imide in the circumferential pressure-withstand portion 51. Therefore, the barrier metal layer 213b is necessitated to form after the passivation film 17 is formed, since the barrier metal layer 213b works as a seed layer of the plating.

(Fifth Embodiment)

Figure 14:
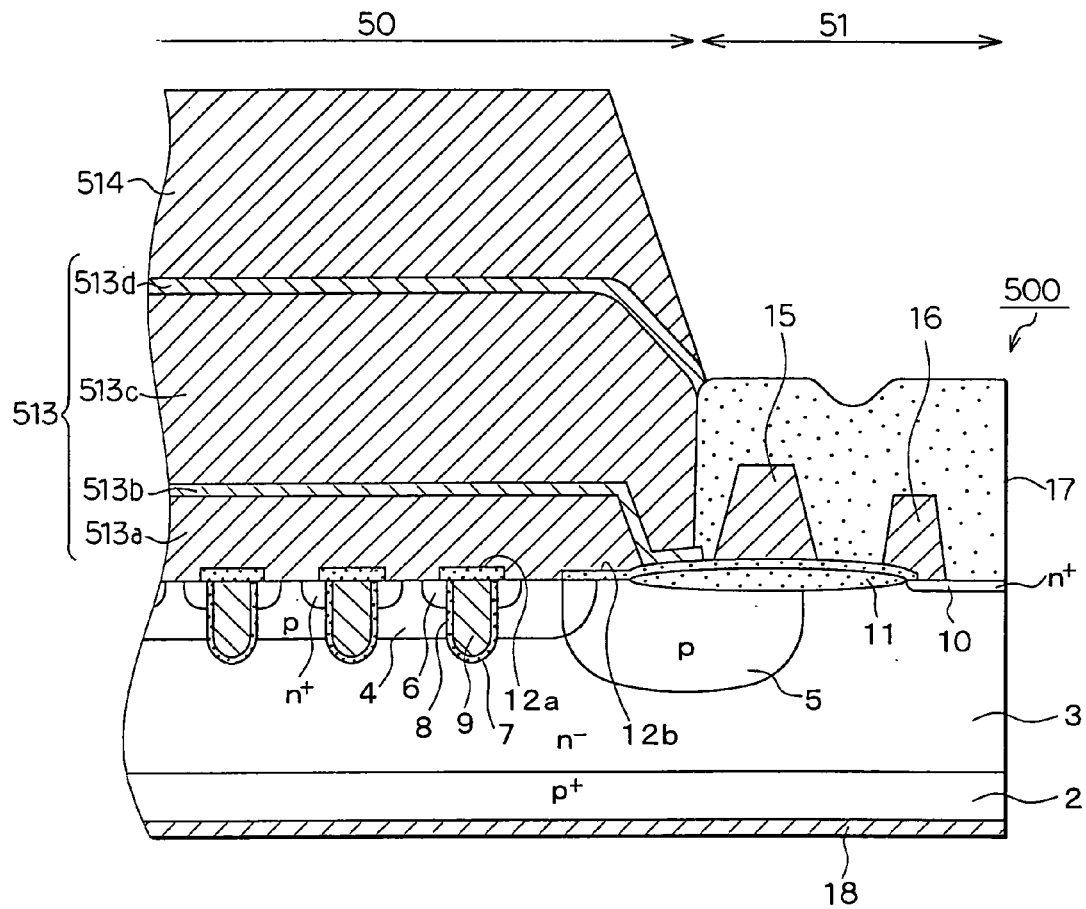
FIG. 14 is a cross sectional view showing a semiconductor chip according to a fifth embodiment of the present invention.
Figure 15:
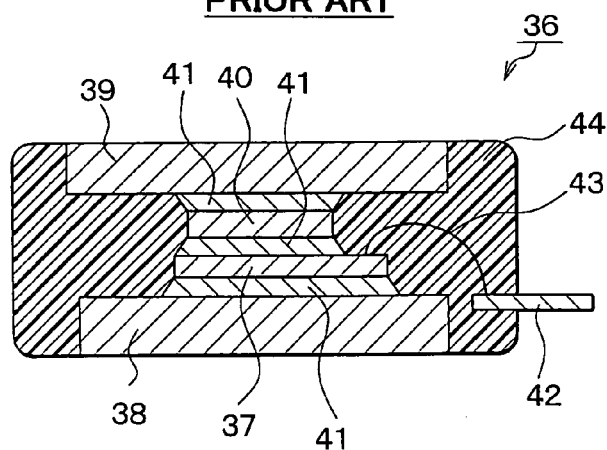
FIG. 15 is a cross sectional view showing a mold type power device including the semiconductor chip sealed with resin, according to a prior art.

A semiconductor chip 500 according to a fifth embodiment of the present invention is shown in FIG. 14. The semiconductor chip 500 includes a emitter electrode 513 having a circuit wiring electrode 513a, a barrier metal layer 513b, a surface protection layer 513c and a fourth layer 513d.

The circuit wiring electrode 513a works as the first conductive layer, which is similar to the circuit wiring electrode 213a shown in FIG. 5, i.e., the circuit wiring electrode 513a corresponds to the first metallic layer 13a in FIG. 1. The thickness of the circuit wiring electrode 513a is about 3 μm, and the circuit wiring electrode 513a is made of aluminum (i.e., Al) alloy such as Al—Si—Cu alloy by a sputtering method or the like.

The barrier metal layer 513b works as a substrate (i.e., a seed layer for plating) for forming the surface protection layer 513c by a wet electroless plating method. The barrier metal layer 513b works as the third conductive layer, which is similar to the barrier metal layer 213b shown in FIG. 5, and does not correspond to the third metallic layer 13c in FIG. 1. The barrier metal layer 513b is a conductive metallic layer for electrically connecting to the circuit wiring electrode 513a. The barrier metal layer 513b is made of, for example, titanium (i.e., Ti) layer and a titanium nitride (i.e., TiN) layer by the sputtering method.

The surface protection layer 513c works as the second conduction layer, which is similar to the surface protection layer 213c shown in FIG. 5, i.e., the surface protection layer 513c corresponds to the second metallic layer 13b in FIG. 1. The surface protection layer 513c is formed by the wet electroless plating method. The surface protection layer 513c can be soldered, and has large Young's modulus. The surface protection layer 513c is made of hard material such as Ni or Cu, i.e., a metallic material. The thickness of the surface protection layer 513c is, for example, equal to or larger than 5 μm.

The Young's modulus of the surface protection layer 513c represents as E, and the film thickness of the surface protection layer 513c represents as T. Further, the Young's modulus of the semiconductor substrate, i.e., the P$^+$ type substrate 2 and the N$^-$ type drift layer 3, represents as Esub, and the thickness of the semiconductor substrate represents as Tsub. The material composing the surface protection layer 513c is determined to satisfy the relationship of E×T≅Esub× Tsub.

The fourth metallic layer 513d is made of Au and formed by a plating method. The plated Au prevents the Ni from being oxidized and provides an excellent solder wettability of the solder layer 514. The film thickness of the third metallic layer 513d is, for example, about 0.1 μm. The fourth metallic layer 513d corresponds to the third metallic layer 13c shown in FIG. 1.

A solder layer 514 is formed on the emitter electrode 513. The solder layer 514 is made of ternary solder material composed of Sn, Cu and Ni. That is, the solder layer 514 is made of a Sn—Cu—Ni ternary material. The composition of the solder layer 514 is, for example, such that the Cu in the solder layer 514 is in a range between 0.5 wt % and 2.0 wt %, the Ni is in a range between 0.05 wt % and 0.1 wt %, the Sn is the rest and a small amount of additives may be included. The solder layer 514 composed of the above composition has a small yield stress, which is smaller than that of the circuit wiring electrode 513a. The circuit wiring electrode 513a is made of Al alloy, so that the yield stress of Al alloy of the circuit wiring electrode 513a is higher than that of the solder layer 514.

In the mold type power device, the solder layer 514 for electrically connecting to the IGBT disposed in the semiconductor chip 500 is made of the Sn—Cu—Ni ternary alloy, which has small yield stress smaller than that of the circuit wiring electrode 513a. Therefore, the shear stress generated near the surface of the semiconductor substrate becomes small. Thus, even when the semiconductor chip 500 is sealed with the resin mold 20, the circuit wiring electrode 513a is prevented from cracking. Thus, the emitter electrode 513 is not removed from the semiconductor substrate and the IGBT is protected from being damaged. Further, the surface of the IGBT is protected from being damaged, so that the semiconductor package 21 is protected from being damaged, the damage caused by stopping current flow or heat conduction.

Further, the circuit wiring electrode 513a is protected from affection of the stress on the basis of the difference of the linear expansion coefficient. Accordingly, the circuit wiring electrode 513a is protected from cracking, so that the circuit wiring electrode 513a is prevented from being damaged.

Such changes and modifications are to be understood as being within the scope of the present invention as defined by the appended claims.

What is claimed is:

1. A mold type semiconductor device comprising:
a semiconductor chip including a semiconductor part;
a metallic layer;
a solder layer; and
a metallic member connecting to the semiconductor chip through the metallic layer and the solder layer,
wherein the solder layer is made of solder having yield stress smaller than that of the metallic layer.

2. The device according to claim 1,
wherein the solder layer is made of Sn—Cu—Ni ternary alloy.

3. The device according to claim 1,
wherein the metallic layer includes an aluminum layer made of Al—Si—Cu ternary alloy.

4. The device according to claim 1,
wherein the metallic layer is disposed on a surface of the semiconductor part,
wherein the metallic layer includes a first metallic layer connecting to the semiconductor part electrically, and
wherein the yield stress of the solder layer is smaller than that of the first metallic layer.

5. The device according to claim 4,
wherein the metallic layer is a multi-layered metallic layer including the first metallic layer and a second metallic layer, and
wherein the second metallic layer is disposed on the first metallic layer, and made of metallic material different from that of the first metallic layer.

6. The device according to claim 5,
wherein the first metallic layer includes aluminum, and
wherein the second metallic layer includes nickel.

7. The device according to claim 5,
wherein the first metallic layer includes an aluminum layer having a thickness equal to or thicker than 2 μm.

8. The device according to claim 6,
wherein the second metallic layer is formed by a wet process method.

9. The device according to claim 5,
wherein the first metallic layer includes copper, and
wherein the second metallic layer includes nickel.

10. The device according to claim 9,
wherein the second metallic layer is formed by a wet process method.

11. The device according to claim 9,
wherein the wet process method is a wet electroless plating method.

12. The device according to claim 9,
wherein the solder layer is made of Sn—Ag—Cu ternary alloy.

13. A mold type semiconductor device comprising:
a semiconductor chip including a semiconductor part;
a conductive layer;
a connecting member; and
a metallic member connecting to the semiconductor chip through the conductive layer and the connecting member,
wherein the semiconductor chip further includes:
a semiconductor substrate having the semiconductor part;
a first conductive layer disposed on the semiconductor substrate for providing a part of the conductive layer connecting to the semiconductor part electrically; and
a second conductive layer disposed on the first conductive layer opposite to the semiconductor substrate for providing another part of the conductive layer,
wherein the second conductive layer has a Young's modulus, which is equal to or larger than that of the semiconductor substrate, and
wherein the second conductive layer covers a surface and an edge of the first conductive layer.

14. The device according to claim 13,
wherein the first conductive layer is made of metallic material including aluminum.

15. The device according to claim 13,
wherein the second conductive layer is made of metallic material including nickel or copper.

16. The device according to claim 13,
wherein the second conductive layer has a thickness equal to or larger than 5 μm.

17. The device according to claim 13,
wherein the semiconductor substrate has a Young's modulus representing as Esub and a film thickness representing as Tsub,
wherein the second conductive layer has another Young's modulus representing as E and another film thickness representing as T, and
wherein the Young's moduli and the film thicknesses of the semiconductor substrate and the second conductive layer have following relationship as:

$$E \times T \cong Esub \times Tsub.$$

18. The device according to claim 13,
wherein the connecting member is made of solder having yield stress smaller than that of the conductive layer.

19. The device according to claim 18,
wherein the connecting member is made of Sn—Cu—Ni ternary alloy.

20. The device according to claim 18,
wherein the conductive layer is disposed on a surface of the semiconductor part,
wherein the first conductive layer connects to the semiconductor part electrically, and
wherein the yield stress of the connecting member is smaller than that of the first conductive layer.

21. The device according to claim 20,
wherein the conductive layer is a multi-layered metallic layer including the first conductive layer and the second conductive layer, and
wherein the second conductive layer is disposed on the first conductive layer, and made of metallic material different from that of the first conductive layer.

22. The device according to claim 21,
wherein the first conductive layer includes aluminum, and
wherein the second conductive layer includes nickel.

23. The device according to claim 21, wherein the first conductive layer includes an aluminum layer having a thickness equal to or thicker than 2 μm.

* * * * *